(12) United States Patent
Layh et al.

(10) Patent No.: US 9,007,559 B2
(45) Date of Patent: Apr. 14, 2015

(54) EUV COLLECTOR WITH COOLING DEVICE

(75) Inventors: Michael Layh, Aalen (DE); Udo Dinger, Oberkochen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 819 days.

(21) Appl. No.: 13/214,470

(22) Filed: Aug. 22, 2011

(65) Prior Publication Data
US 2012/0050703 A1     Mar. 1, 2012

Related U.S. Application Data

(60) Provisional application No. 61/378,413, filed on Aug. 31, 2010.

(30) Foreign Application Priority Data

Aug. 31, 2010    (DE) .................. 10 2010 039 965

(51) Int. Cl.
| | |
|---|---|
| *G03B 27/52* | (2006.01) |
| *G03B 27/54* | (2006.01) |
| *G21K 1/06* | (2006.01) |
| *G03F 7/20* | (2006.01) |

(52) U.S. Cl.
CPC ............ *G21K 1/06* (2013.01); *G03F 7/70175* (2013.01); *G03F 7/70891* (2013.01); *G21K 2201/065* (2013.01); *G21K 2201/067* (2013.01)

(58) Field of Classification Search
CPC ............ G03F 7/70175; G03F 7/70891; G03F 7/70166; G03F 7/70883; G03F 7/70875
USPC .................... 355/66, 67, 30; 359/846, 845
See application file for complete search history.

(56) References Cited

U.S. PATENT DOCUMENTS

| | | |
|---|---|---|
| 6,028,660 A | 2/2000 | Van Der Laan et al. |
| 6,822,251 B1 | 11/2004 | Arenberg et al. |
| 6,859,515 B2 | 2/2005 | Schultz et al. |

(Continued)

FOREIGN PATENT DOCUMENTS

| | | |
|---|---|---|
| CN | 1182486 | 5/1998 |
| CN | 1495528 | 5/2004 |

(Continued)

OTHER PUBLICATIONS

Japanese Examination Report, with English translation, for corresponding JP Appl. No. 2011-203755, dated Nov. 21, 2012.

(Continued)

*Primary Examiner* — Peter B Kim
*Assistant Examiner* — Michell Iacoletti
(74) *Attorney, Agent, or Firm* — Fish & Richardson P.C.

(57) ABSTRACT

An EUV collector for collecting and transmitting radiation from an EUV radiation source includes at least one collector mirror for reflecting an emission of the EUV radiation source, which is rotationally symmetric with respect to a central axis. The EUV collector also includes a cooling device for cooling the at least one collector mirror. The cooling device has at least one cooling element, which has a course with respect to the collector mirror, in each case, such that the projection of the course into a plane perpendicular to the central axis has a main direction, which encloses an angle of at most 20° with respect to a predetermined preferred direction. The collector transmits improved quality radiation to illuminate an object field.

13 Claims, 8 Drawing Sheets

(56) References Cited

U.S. PATENT DOCUMENTS

| | | |
|---|---|---|
| 6,959,992 B2 * | 11/2005 | Bischof .................. 359/845 |
| 7,329,014 B2 | 2/2008 | Balogh et al. |
| 2004/0109151 A1 | 6/2004 | Bakker et al. |
| 2004/0227103 A1 | 11/2004 | Singer et al. |
| 2006/0131515 A1 | 6/2006 | Partlo et al. |
| 2006/0221440 A1 | 10/2006 | Banine et al. |
| 2006/0227826 A1 | 10/2006 | Balogh et al. |
| 2010/0007866 A1 * | 1/2010 | Warm et al. .................. 355/66 |
| 2013/0100426 A1 | 4/2013 | Warm et al. |

FOREIGN PATENT DOCUMENTS

| | | |
|---|---|---|
| CN | 1771072 | 5/2006 |
| CN | 1841098 | 10/2006 |
| DE | 10 2005 017 262 B3 | 10/2006 |
| DE | 10 2005 053 415 A1 | 5/2007 |
| DE | 10 2007 041 004 A1 | 3/2009 |
| JP | 2004-039851 | 2/2004 |
| JP | 2004-095993 | 3/2004 |
| JP | 2006-317913 | 11/2006 |
| JP | 2010-141071 | 6/2010 |
| JP | 2010-519725 | 6/2010 |
| WO | WO 2005/047980 | 5/2005 |
| WO | WO 2007/051638 | 5/2007 |
| WO | WO 2008101656 A2 * | 8/2008 |
| WO | WO 2009/095219 A1 | 8/2009 |
| WO | WO 2009/095220 A2 | 8/2009 |

OTHER PUBLICATIONS

The Germany Examination Report, with English translation, for corresponding DE Appl. No. 10 2010 039 965.5, dated Mar. 10, 2011.
The German Office Action, with English translation, for corresponding DE Appl. No. 10 2010 039 965.5, dated Oct. 17, 2013.
The Japanese Office Action, with English translation, for corresponding JP Appl No. 2011-203755, dated Sep. 30, 2013.
Chinese Office Action, with translation thereof, for corresponding CN Appl No. 201110254363.4, dated Aug. 19, 2013.
Second Chinese office action, with translation thereof, for CN Appl No. 2011 1025 4363.4, dated Apr. 30, 2014.

* cited by examiner

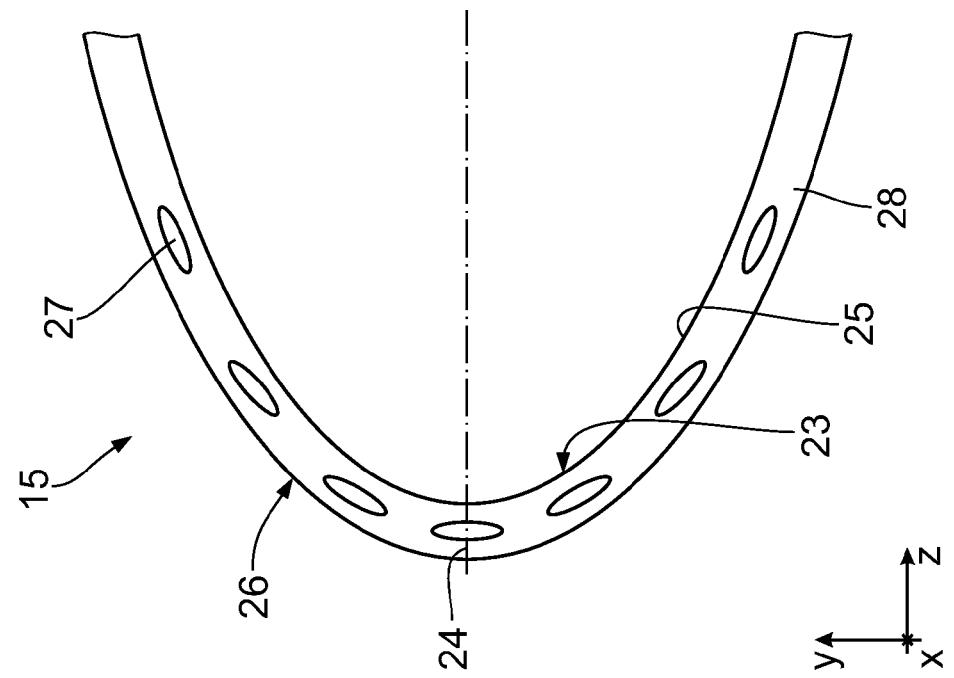
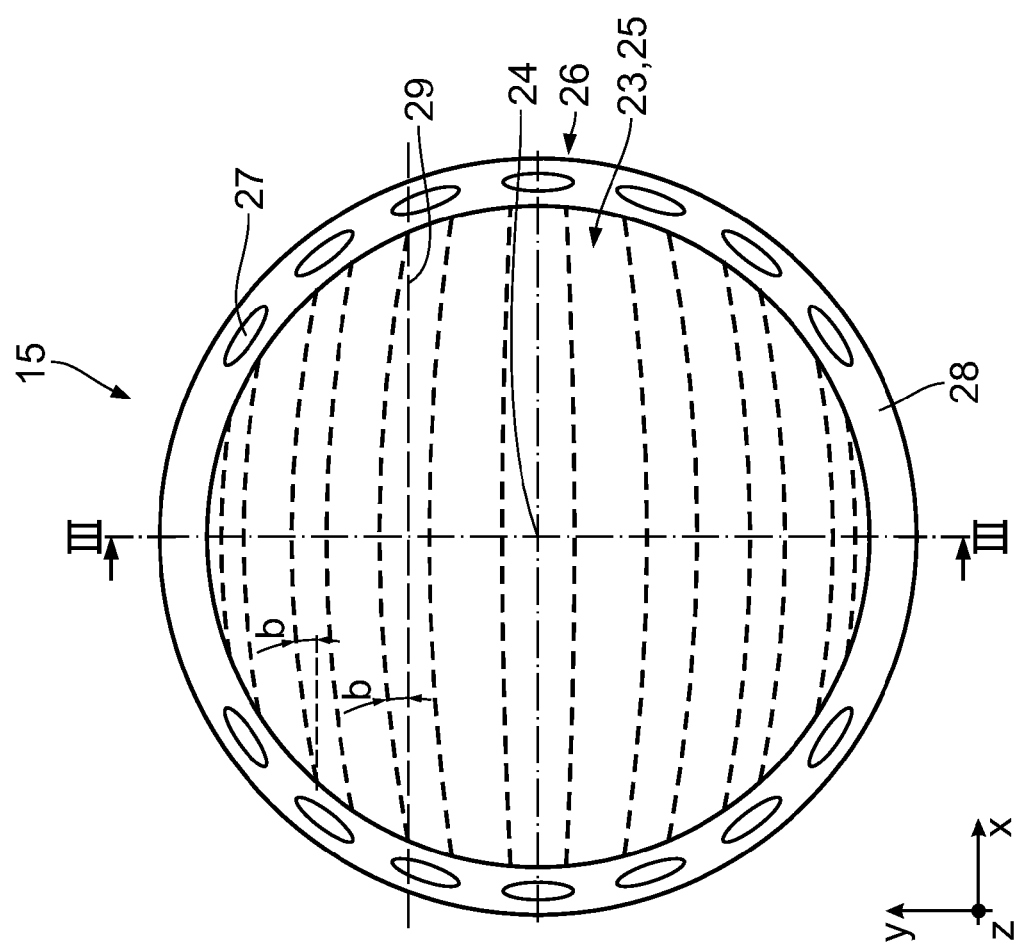

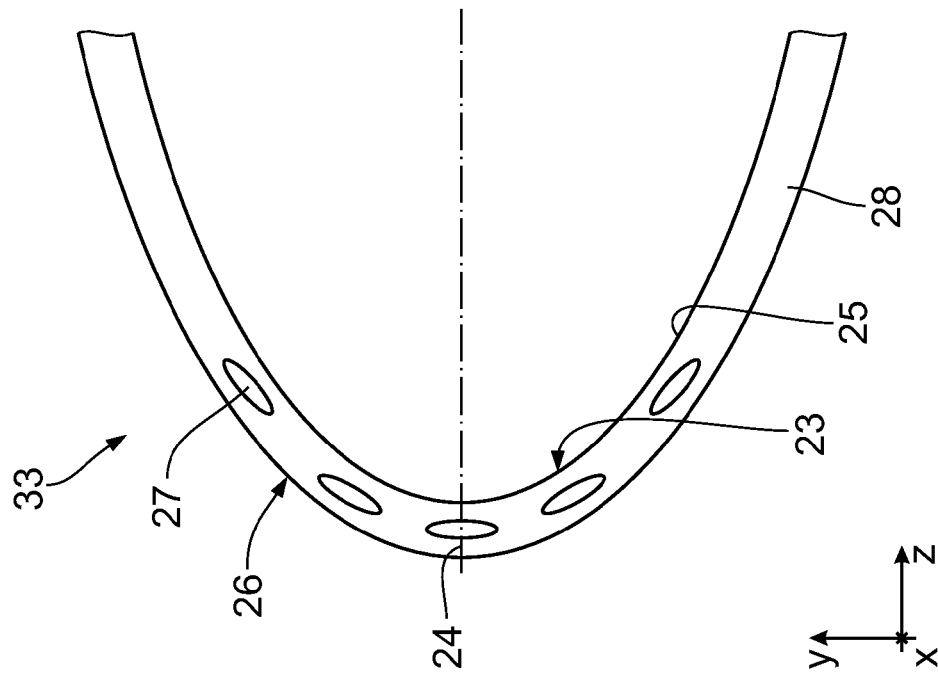
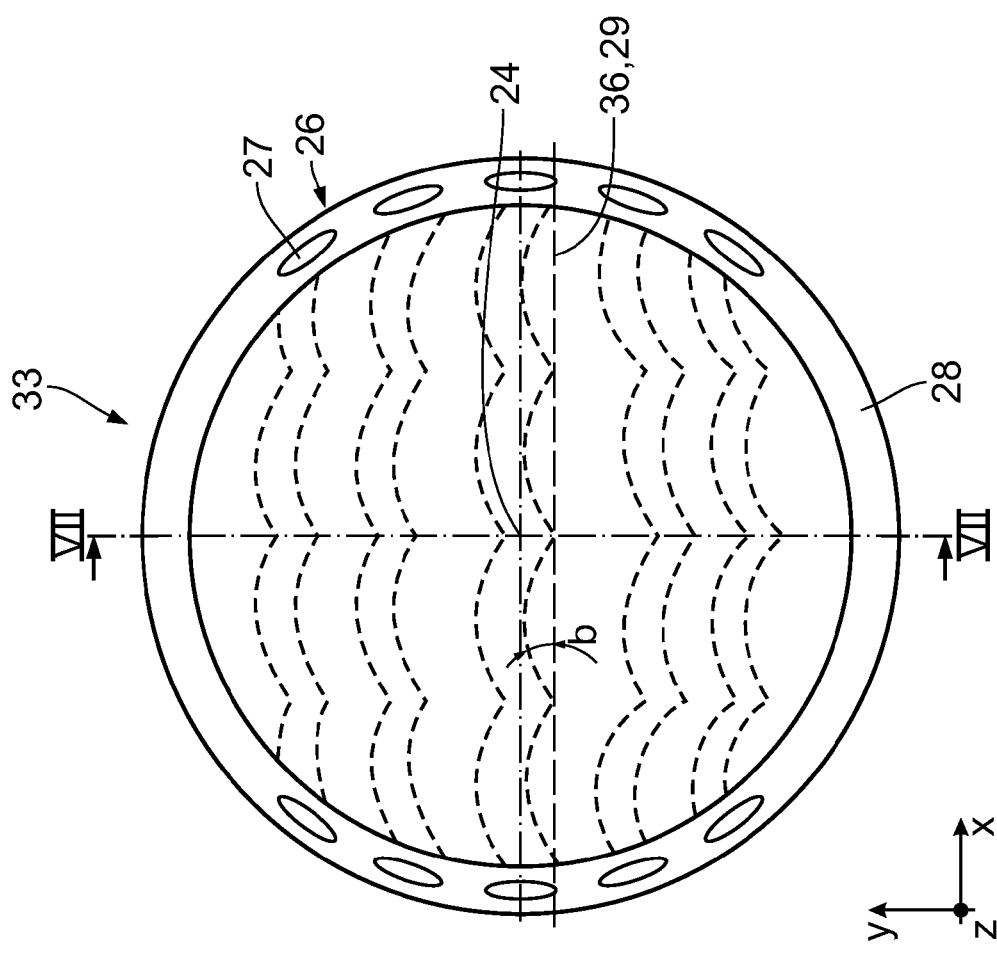

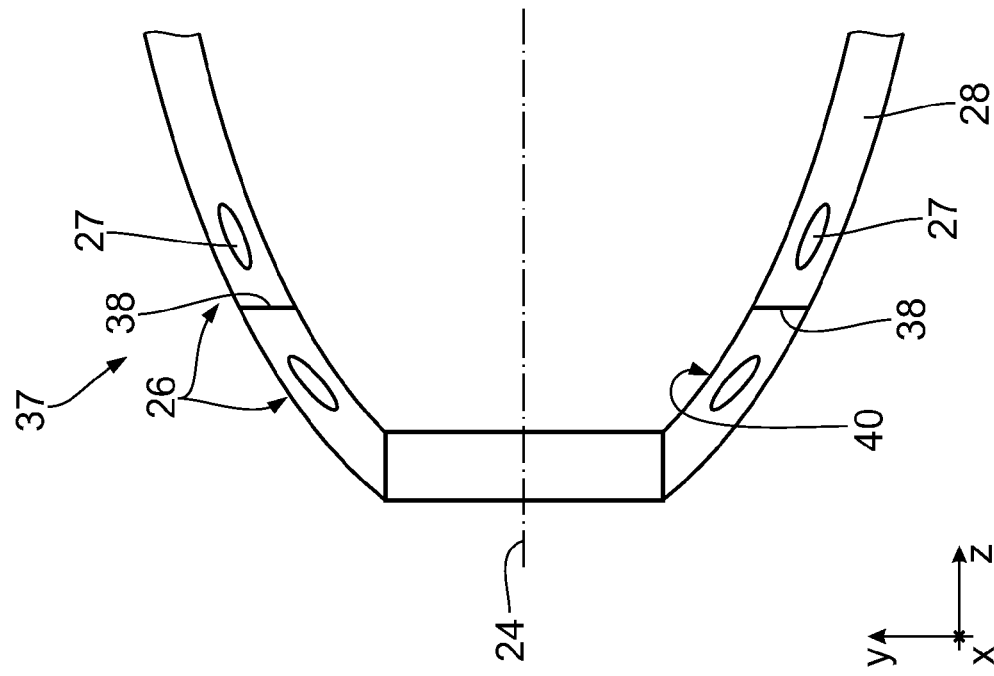
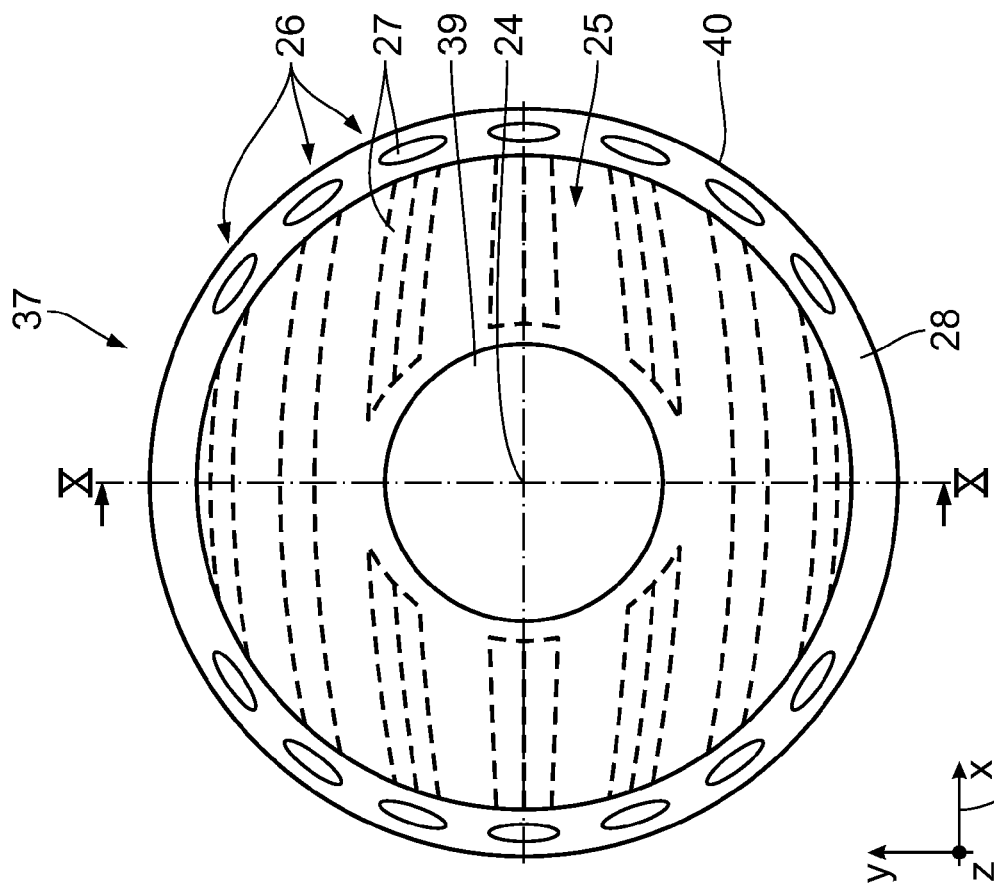

EUV COLLECTOR WITH COOLING DEVICE

CROSS-REFERENCE TO RELATED APPLICATIONS

This application claims benefit under 35 USC 119 of German Patent Application Serial No. 10 2010 039 965.5, filed on Aug. 31, 2010, and claims priority under 35 USC 119(e) to U.S. Provisional Patent Application Ser. No. 61/378,413, filed on Aug. 31, 2010. The contents of these applications are incorporated herein by reference in their entirety.

FIELD

The disclosure relates to a collector for collecting radiation from an EUV (extreme ultraviolet) radiation source. Furthermore, the disclosure relates to an illumination system with a collector of this type, a projection exposure system with an illumination system of this type, a method for producing a microstructured or nanostructured component with a projection exposure system of this type and a component produced by the method.

BACKGROUND

EUV Collectors are known from WO 2007/051638 A1, WO 2009/095219 A1, DE 10 2007 041 004 A1 and US 2004/0227103 A1.

SUMMARY

An aspect of the present disclosure is to develop a collector that transmits improved quality light to an object field.

The disclosure provides a collector for collecting and transmitting radiation from an EUV radiation source. The collector includes at least one collector mirror which is rotationally symmetric with respect to a central axis and which reflects an emission of the EUV radiation source. The collector also includes a cooling device for cooling the at least one collector mirror. The cooling device has at least one cooling element. Each cooling element has a course with respect to the at least one collector mirror so that, in each case, the projection of the course into a plane perpendicular to the central axis has a main direction which encloses an angle b of at most 20° with respect to a predetermined preferred direction.

It was recognised according to the disclosure that the light distribution in the object field plane strongly depends on the precise intensity distribution at the entry of the illumination system. Surface faults and, in particular, other surface deformations of the collector have a significant influence here on the light distribution in the object field plane. A main reason for surface deformations of a collector mirror when operating an illumination system are thermal deformations. In order to effectively transport the thermal load away, cooling concepts are provided for the collector. According to the disclosure, it was also recognised that the light distribution in the object field plane depends with varying sensitivity on the precise structure and, in particular, the orientation of the surface deformations of the collector mirror. In particular, the light distribution on the reticle can be improved by matching the cooling concept of the collector to the precise design of the illumination system. An improvement is achieved, in particular by using a cooling device with at least one cooling element, which is oriented so that the projection of a main direction of its course into a plane perpendicular to a central axis of the collector encloses an angle b of at most 20° with respect to a predetermined preferred direction. The collector mirror may be an ellipsoidal mirror or a mirror of the Wolter type I or II. A combination of mirrors of this type is also possible. The collector mirror may be part of an arrangement of a plurality of mirror shells arranged inside one another. The cooling device may have precisely one cooling element. In this case, the angle b between the projection of the course of precisely this one cooling element into a plane perpendicular to the axis of symmetry of the collector mirror and the predetermined preferred direction is at most 20°. If the cooling device has a plurality of cooling elements, at least a fraction of these cooling elements, which is greater than 50%, with its course projection into a plane perpendicular to the central axis of symmetry of the collector mirror, encloses an angle b of at most 20° with respect to a predetermined preferred direction. In some embodiments in which the cooling device has a plurality of cooling element, all the cooling elements have a course with respect to the collector mirror such that the projection of the course into a plane perpendicular to the central axis has a main direction, which encloses an angle b of at most 20° with respect to a predetermined preferred direction. In the case of field facets configured in a linear manner, the cooling elements may be arranged with respect to the collector mirror so that the projection of their course into the plane perpendicular to the central axis is linear. In the case of curved (in particular annular segment-shaped) field facets, the projection of the course of the at least one cooling element may preferably have a corresponding curvature. A main direction of the projection of the course is defined here by the chord of the corresponding annular segment.

The angle b between the projection of the main direction into the plane perpendicular to the central axis and the predetermined preferred direction is preferably at most 7°. The preferred direction may be the scanning direction of an object which is arranged in the object field and is to be imaged with high quality with the aid of the radiation from the EUV radiation source.

The projection of the course is preferably parallel to the predetermined preferred direction. As a predetermined course of a cooling element leads to a specific course of an intensity modulation in the object field plane, an intensity modulation along a scanning direction is integrated away in a scanning exposure of the object field, while disturbances of the illumination field in the cross-scanning direction, in other words, transverse or perpendicular to the scanning direction, lead to a local variation in the exposure dose, which is not averaged during scanning exposure either.

The cooling device preferably has at least two (e.g., at least three, at least five, at least seven) spatially separate cooling elements. This allows a more targeted and homogeneous cooling of the collector mirror.

The homogeneity of the light distribution in the object field is further improved by an arrangement of the cooling elements so that the projection of their course into the plane perpendicular to the central axis is at least approximately, at least in portions, parallel to one another.

The separate cooling elements are preferably controllable independently of one another. As a result, the cooling of the collector mirror can be adapted more flexibly, in particular dynamically, to the conditions occurring during operation of the illumination system.

The configuration of the cooling elements as cooling channels which can be loaded with a cooling medium is a structurally simple possibility which leads to efficient cooling of the collector mirror.

A further aspect of the disclosure includes an illumination system with a collector according to the disclosure.

Such an illumination system includes a collector and an illumination optical system for illuminating an object field, which can be imaged by an imaging optical system, with the radiation collected by the collector.

The advantages of an illumination system of this type correspond to those which were discussed above for the collector according to the disclosure.

In an illumination system with an illumination optical system, which has at least one facet mirror with a plurality of elongate facets, the preferred direction for the orientation of at least one cooling element is predetermined by the longitudinal orientation of the facets. As the facets, in order to illuminate the object field, are projected therein, the light distribution in the object field can be further improved with a scanning exposure in the direction perpendicular to the longitudinal orientation of the projected facets by this orientation of the cooling elements.

For applications in EUV projection microlithography, the illumination system preferably has at least one EUV radiation source.

Another aspect of the disclosure includes a projection exposure system with the illumination system according to the disclosure and an imaging optical system for imaging the object field into an image field. The projection exposure system is preferably configured as a scanner. The projection exposure system then has, both for the object to be imaged and for a substrate, on which the imaging takes place (e.g., a wafer), a holder that can be displaced in the scanning direction during the projection exposure. The advantages of a projection exposure system correspond to those which have already been discussed above.

Further aspects of the disclosure include a method for producing a component (such as a microstructured or a nanostructured component) using the projection exposure system, and a component produced by the method. The production method includes providing a reticle, providing a wafer with a light-sensitive coating, projecting at least a portion of the reticle onto the wafer with the aid of the projection exposure system including an illumination system and an imaging optical system for imaging the object field in an image field, and developing the exposed light-sensitive coating on the wafer. The advantages of a production method and product correspond to those which have already been discussed above.

BRIEF DESCRIPTION OF THE DRAWINGS

Embodiments of the disclosure are described in more detail below with the aid of the drawings, in which:

FIG. 2 shows a schematic view of a collector mirror in the direction of its central axis;

FIG. 3 schematically shows a meridional section along the line III-III of the collector mirror according to FIG. 2;

FIGS. 6 and 7 show views in accordance with FIGS. 2 and 3 of a further embodiment of the collector mirror;

FIGS. 9 and 10 show corresponding views of a third embodiment of the collector mirror;

DESCRIPTION OF THE PREFERRED EMBODIMENTS

Figure 1:
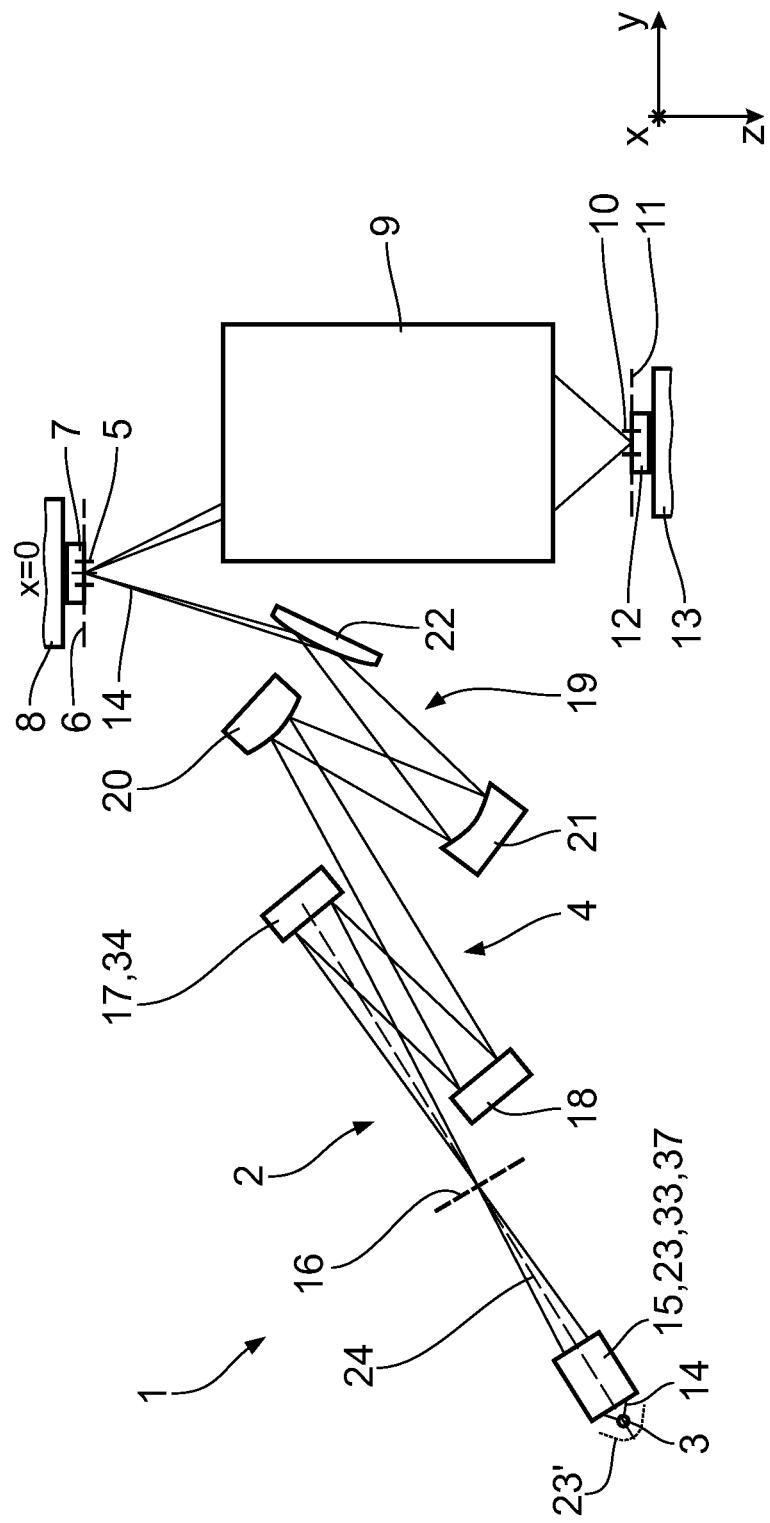
FIG. 1 schematically shows a meridional section through a projection exposure system for EUV projection lithography.

FIG. 1 schematically shows, in a meridional section, a projection exposure system 1 for microlithography. An illumination system 2 of the projection exposure system 1, apart from a radiation source 3, has an illumination optical system 4 for exposing an object field 5 in an object plane 6. A reticle 7, which is arranged in the object field 5 and is held by a reticle holder 8, shown only cutout-wise, is exposed here. A projection optical system 9 is used to image the object field 5 in an image field 10 in an image plane 11. A structure on the reticle 7 is imaged on a light-sensitive layer of a wafer 12, which is arranged in the region of the image field 10 in the image plane 11 and is held by a wafer holder 13, also shown schematically.

The radiation source 3 is an EUV radiation source with an emitted useful radiation in the range between 5 nm and 30 nm. This may be a plasma source, for example a GDPP source (Gas Discharge-Produced Plasma) or an LPP source (Laser-Produced Plasma). A radiation source based on a synchrotron can also be used for the radiation source 3. Information with regard to a radiation source of this type can be found by the person skilled in the art, for example, from U.S. Pat. No. 6,859,515 B2. EUV radiation 14, which is emitted from the radiation source 3, is bundled by a collector 15. After the collector 15, the EUV radiation 14 propagates through an intermediate focal plane 16 before it impinges on a field facet mirror 17. The field facet mirror 17 is arranged in a plane of the illumination optical system 4, which is optically conjugated to the object plane 6.

The EUV radiation 14 is also called illumination light or imaging light below.

After the field facet mirror 17, the EUV radiation 14 is reflected by a pupil facet mirror 18. The pupil facet mirror 18 is arranged in a pupil plane of the illumination optical system 4, which is optically conjugated to a pupil plane of the projection optical system 9. With the aid of the pupil facet mirror 18 and an imaging optical assembly group in the form of a transmission optical system 19 with mirrors 20, 21 and 22 designated in the order of the beam path, field facets of the field facet mirror 17 are imaged in the object field 5. The last mirror 22 of the transmission optical system 19 is a grazing incidence mirror. The pupil facet mirror 18 and the transmission optical system 19 form a following optical system for transferring the illumination light 14 into the object field 5. The transmission optical system 9 can be dispensed with, in particular, when the pupil facet mirror 18 is arranged in an entry pupil of the projection optical system 9.

A Cartesian xyz-coordinate system is drawn in FIG. 1 for simpler description of positional relationships. The x-axis runs perpendicular to the drawing plane and into it in FIG. 1. The y-axis runs to the right. The z-axis runs downward. The object plane 6 and the image plane 11 both run parallel to the xy-plane.

The reticle holder 8 can be displaced in a controlled manner in such a way that, during the projection exposure, the reticle 7 can be displaced in a displacement direction in the object plane 6 parallel to the y-direction. Accordingly, the wafer holder 13 can be displaced in a controlled manner in such a way that the wafer 12 can be displaced in a displacement direction in the image plane 11 parallel to the y-direction. As a result, the reticle 7 and the wafer 12, on the one hand, can be scanned by the object field 5 and on the other hand, by the image field 10. The displacement direction will also be called the scanning direction below. The displacement of the reticle 7 and the wafer 12 in the scanning direction may preferably take place synchronously with respect to one another. A first embodiment of the collector 15 will be described in more detail below with reference to FIGS. 2 to 4.

The collector 15 shown only schematically in FIG. 1 includes at least one collector mirror 23 for reflecting the EUV radiation 14 of the EUV radiation source 3.

In contrast to the only schematic view in FIG. 1, at least one collector mirror 23 may also be arranged in the beam direction behind the radiation source 3. The arrangement of the collector mirror behind the radiation source 3 is shown at 23' by dashed lines in FIG. 1. The reference numeral 23 will be used below uniformly if reference is made to the collector mirror.

The collector mirror 23 is in each case rotationally symmetric configured with respect to a central axis 24. The collector mirror 23 shown in FIGS. 2 to 4 is an ellipsoidal mirror with an ellipsoidal mirror face 25.

The radiation source 3 is arranged in a focal point of the ellipsoidal form of the mirror face 25. The other focal point of the ellipsoidal form of the mirror face 25 lies in the intermediate focal plane 16. The ellipsoidal collector mirror 23 is used to receive and reflect the total EUV radiation 14 emitted in the backward direction of the radiation source 3, in other words the radiation that is emitted proceeding from the radiation source 3 into the half space remote from the intermediate focus 16. In addition, the ellipsoidal collector mirror 23 can also reflect a part of the EUV radiation 14 emitted in the forward direction. To collect EUV radiation emitted in the forward direction, the collector mirror 23, as shown schematically by a continuous line in FIG. 1, may also be of the Wolter mirror optical system type, as will also be explained below in conjunction with the configuration according to FIGS. 9 and 10.

As a part of the EUV radiation 14 emitted by the radiation source 3 and reflected by the collector mirror 23 is absorbed by the collector mirror 23, the collector mirror 23 may heat up during operation of the projection exposure system 1. This may lead to thermal deformation of the collector mirror 23. In order to minimise deformations of this type, the EUV collector 15 is provided with a cooling device 26. The cooling device 26 is used, in particular, to cool the collector mirror 23. The cooling device 26 includes at least one cooling element 27. The at least one cooling element 27 is, for example, configured as a cooling channel, which can be loaded with a cooling medium. A cooling gas or a cooling liquid may be used as the cooling medium. Water or glycol is preferably provided as the cooling medium.

Figure 4:
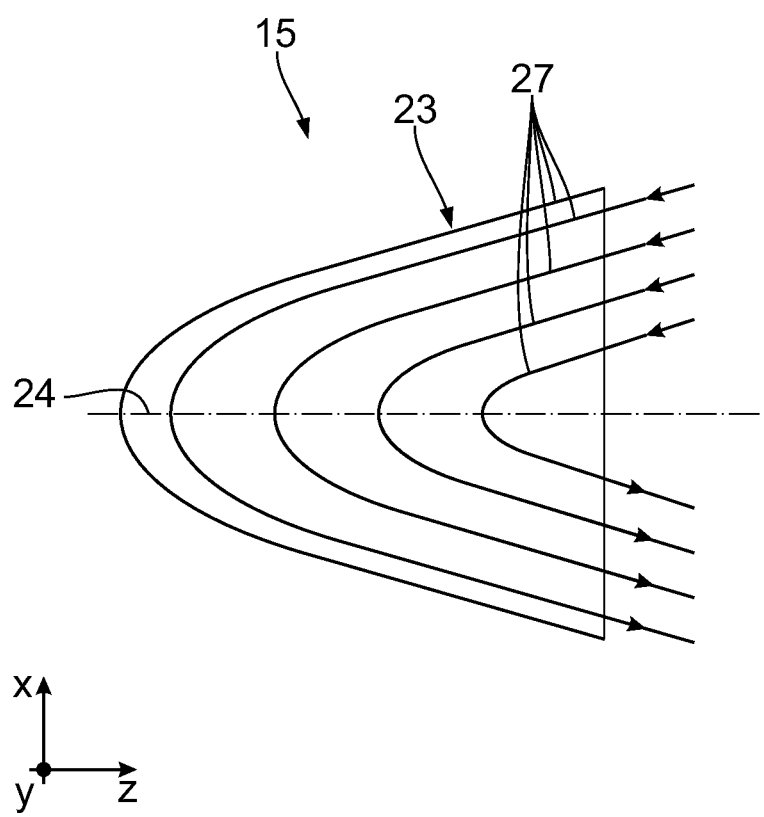
FIG. 4 shows a schematic side view of the collector mirror according to FIG. 2, viewed in a viewing direction, which is perpendicular to the viewing direction according to FIG. 3.

A collector mirror 23 with seven cooling channels is shown in FIGS. 2 to 4. A different number of cooling elements 27 is also possible, however. The cooling device 26 preferably has at least two (e.g., at least three, at least five, at least seven) spatially separate cooling elements 27.

The cooling elements 27 are integrated in the substrate 28 of the collector 15. As a result, a particularly efficient cooling of the collector 15 is made possible. An arrangement of the cooling elements 27, wherein these are arranged on the collector 15 and rigidly connected thereto, is also possible.

The cooling elements 27, preferably configured as cooling channels, are configured to be cooling medium-tight. To load the cooling channels with the cooling medium, they are connected by feed and discharge lines, not shown in the figures, to a cooling medium reservoir, also not shown in the figures.

A local Cartesian xyz-coordinate system is drawn in FIGS. 2 to 8, in each case, for simpler description of positional relationships. The coordinate system is arranged here in such a way that the z-direction in each case points in the main expansion direction of the EUV radiation 14 in the region of the collector mirror 23. In the region of the collector 15, the z-direction is therefore parallel to the central axis 24 of the collector mirror 23. In FIG. 2, the x-direction runs to the right. The y-direction runs upwardly. The z-direction runs perpendicular to the drawing plane of FIG. 2 toward the observer. The x-direction of the local xyz-coordinate systems according to FIGS. 2 to 8 runs parallel to the x-direction of the global xyz-coordinate system according to FIG. 1. In the region of the object plane 6, the y-direction corresponds to a scanning direction, while the x-direction corresponds to a cross-scanning direction.

According to the disclosure, the cooling elements 27 have a course with respect to the collector mirror 23 such that the projection of their course into the xy-plane, i.e. into a plane perpendicular to the central axis 24, preferably runs parallel to the x-direction. In general, the cooling elements 27 are arranged with respect to the collector mirror 23 in such a way that the projection of their course into the above-defined xy-plane encloses an angle b of at most 20° (in particular of at most 7°) with respect to a predetermined preferred direction 29, with the preferred direction 29 corresponding to the x-direction in the above defined coordinate system. As already mentioned, the x-direction corresponds, in the region of the object plane 6 to the cross-scanning direction.

As shown in FIG. 2, the cooling elements 27 are arranged in the substrate 28 of the collector in such a way that the projection of their course into the xy-plane is at least approximately parallel to one another. Approximately parallel is to be understood to mean here that the projections of the course of two cooling elements 27 into the xy-plane enclose an angle of at most 7°. The projection of the course of the cooling elements 27 into the xy-plane may, in particular, be, in each case, parallel in portions or completely parallel.

In a particularly advantageous embodiment, the separate cooling elements 27 can be controlled independently of one another. They can be loaded, in particular, independently of one another with the cooling medium.

As already mentioned, the illumination system 2 includes the collector 15 and the illumination optical system 4, the illumination optical system 4 including the field facet mirror 17. For details of the field facet mirror 17, reference is made to DE 10 2007 041 004 A1, in particular FIG. 3 thereof. The field facet mirror 17 has a large number of elongate facets 30. The facets 30 are rectangular, in each case. They have an aspect ratio of at least 1:2, in particular at least 1:3, preferably at least 1:5. This is to be taken to mean that the longer side of a facet 30 is, in each case, at least twice, in particular at least three times, in particular at least five times, as long as the shorter side of the facet 30. The aspect ratio of the facets 30 is, in particular, in the range of between 1:15 and 1:30. The aspect ratio of the facets corresponds to the aspect ratio of the object field 5. The radiation 14 from the radiation source 3 is broken up into a large number of radiation bundles by the field facets 30. The facets 30 are used to produce secondary light sources. These are imaged via the pupil facet mirror 18 in the object plane 6.

The facets 30 are arranged on the field facet mirror 17 in such way that their image in the object plane 6 in each case extends parallel to the x-direction, i.e. to the cross-scanning direction. This is taken to mean that during the projection of the facets 30 into the object plane 6, the long side of each facet runs parallel to the x-direction, i.e. to the cross-scanning direction, while the short side of each facet 30 points in the y-direction, i.e. in the scanning direction.

The facets 30, together with the pupil facets of the pupil facet mirror 18, which are not shown in the drawing, are used to produce a defined illumination setting to illuminate and light the object field 5.

According to the embodiment shown in FIGS. 2 to 4 of the collector 15, the above-described preferred direction 29 for the orientation of the cooling elements 27 is predetermined precisely by the longitudinal orientation of the facets 30. In other words, the preferred direction 29 corresponds precisely to the projection of the longitudinal orientation of the facets 30 into the xy-plane, i.e. into the plane perpendicular to the central axis 24. In the schematic view according to FIG. 5, in which the facets 30 are all shown untilted, the longitudinal orientation of the facets 30 coincides with x-direction.

Figure 5:
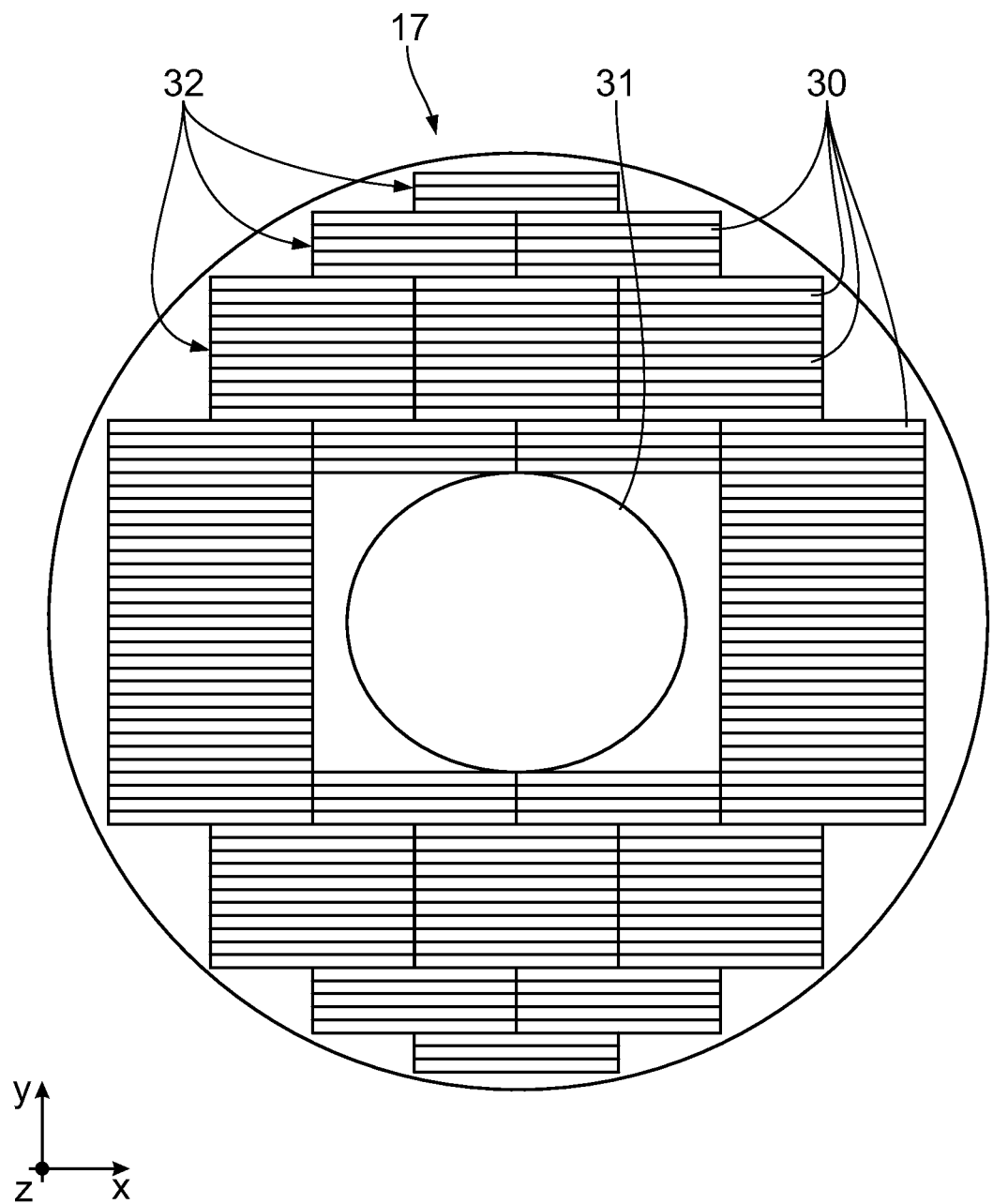
FIG. 5 shows a field facet mirror of an illumination optical system according to a first embodiment.

An inner illumination limit 31 of the field facet mirror 17 is also schematically shown in FIG. 5. This may, for example, be caused by a centre stop of the collector 15, not shown in the figures.

The field facet mirror 17 has a large number of field facet groups 32, which are in turn constructed from a large number of individual facets 30.

For further details of the facet mirror, reference is made to DE 10 2007 041 004 A1, in particular FIG. 3 thereof.

Figure 8:
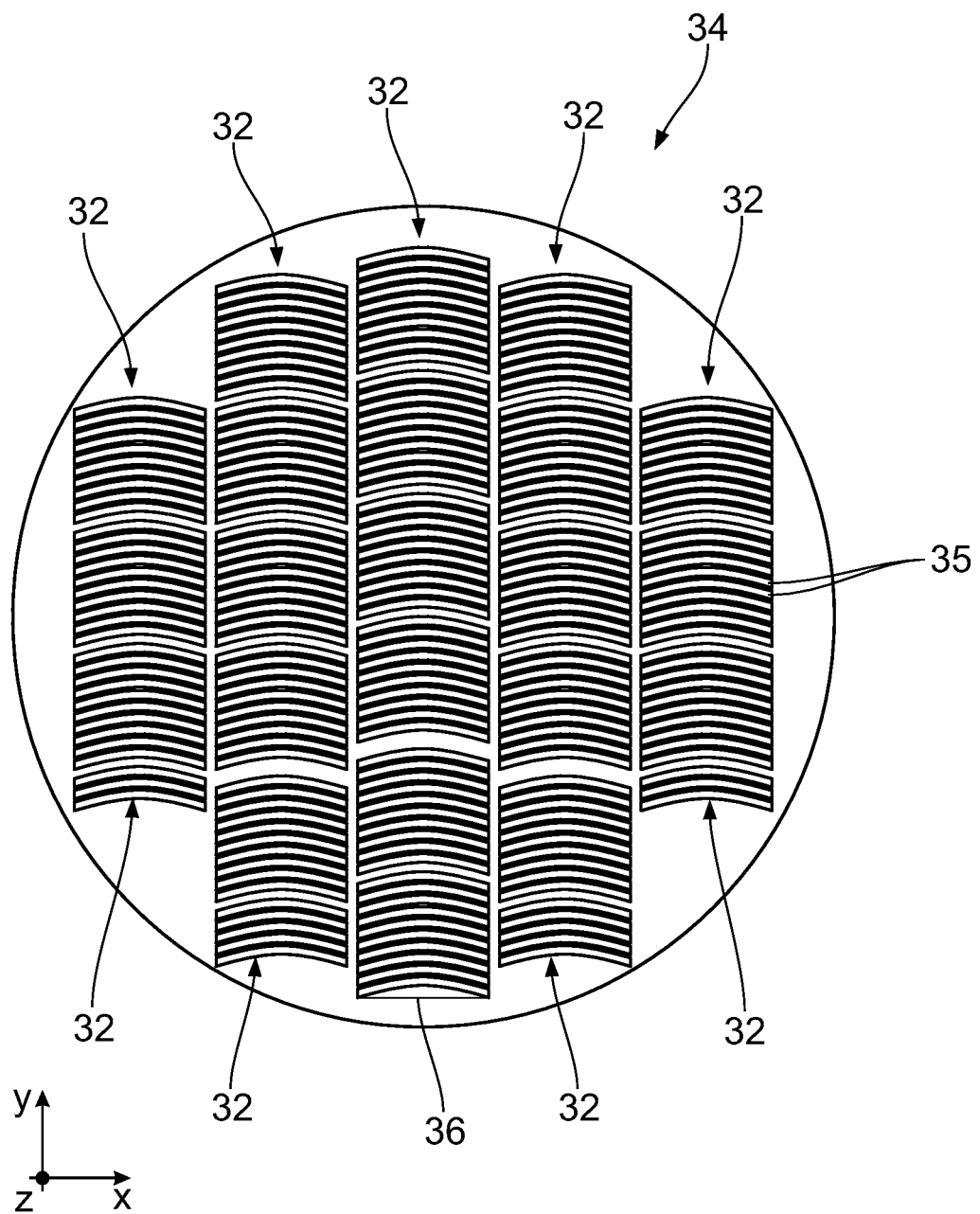
FIG. 8 shows a field facet mirror of the illumination optical system according to a second embodiment.

A further embodiment of the collector 33 and an illumination system 2 with the corresponding collector 33 and a field facet mirror 34 will be described below with the aid of FIGS. 6 to 8. Components, which correspond to those, which have already been described above with reference to FIGS. 1 to 5, have the same reference numerals and will not be discussed again in detail.

The collector 33 (cf. FIGS. 6 and 7), apart from the arrangement of the cooling elements 27 of the cooling device 26, corresponds to the above-described collector 15.

The field facet mirror 34 (cf. FIG. 8) also has a large number of field facet groups 32 with a large number of facets 35. The field facet groups 32 are arranged column-wise in this embodiment. According to this embodiment, the individual facets 35 are arcuate. The arcuate facets 35 have an aspect ratio corresponding to that of the rectangular facets 30 of the already described embodiment. Furthermore, a main direction 36 of the facets 35 is taken to mean, in each case, the direction parallel to the chord of the arc of a circle segment, which is provided by the facets 35, in other words to the x-direction in FIG. 8.

The course of the cooling elements 27 with respect to the collector mirror 23 is configured in accordance with the arcuate facets. In other words, the cooling elements 27 in this embodiment have a course with respect to the collector mirror 23 such that the projection of this course into the xy-plane, i.e. into the plane perpendicular to the central axis 24, has arcuate, in particular arc of a circle-shaped segments, the main direction of which is parallel to the predetermined preferred direction 29, in other words to the x-direction in FIG. 6. The preferred direction 29, in accordance with the already-described embodiment, is defined here by the projection of the main direction 36 of the facets 35. In general, the projection of the course of the cooling elements 27, in particular the main direction of the projection of the course of the cooling elements 27, into the xy-plane, encloses an angle b of at most 20°, in particular at most 7°, with the preferred direction 29.

The number of arcuate segments of the cooling elements 27 preferably corresponds precisely to the number of columns of field facet groups 32 on the field facet mirror 34.

A further embodiment of a collector 37 will be described below with the aid of FIGS. 9 and 10.

According to this embodiment, the collector 37 has a plurality of mirror shells 40 located inside one another, of which one is shown in FIGS. 9 and 10. A corresponding collector is, for example, known from DE 10 2007 041 004 A1, to which reference is hereby made. The collector 37, for example, has a mirror shell 40, two mirror shells 40 or more than two mirror shells 40 located inside one another, in particular three, four, five or even more mirror shells 40 located inside one another.

The mirror shells 40 located inside one another form a type I or type II Wolter optical system. They have a kink region 38 running round the central axis 24, which is only schematically indicated in FIG. 10. The mirror shells 40 are designed for grazing incidence. An angle of incidence of the EUV radiation 14 on the mirror shells 40 is thus below a limit angle. The grazingly reflected EUV radiation 14 is reflected by the mirror shells 40, in each case, precisely twice, namely once before the kink region 38 and once after the kink region 38. A collector 37 of this type is known form WO 2009/095219 A1 and WO 2009/095220 A2.

The mirror shells 40, in their central region around the axis 24, in each case have a through-opening 39. The cooling elements 27, which run at the level of the through-opening 39 with regard to the y-direction, may be folded back onto themselves. As an alternative to this, a feed and/or discharge line for the cooling medium through the through-opening 39 is also possible.

The collector 37 is in each case arranged in the half space of the radiation source 3 facing the intermediate focal plane 16.

Obviously, the cooling elements 27 may also be configured in this embodiment in the case of a field facet mirror with curved facets in accordance with the embodiment of the cooling elements 27 with curved portions described in FIGS. 6 and 7.

Figure 11:
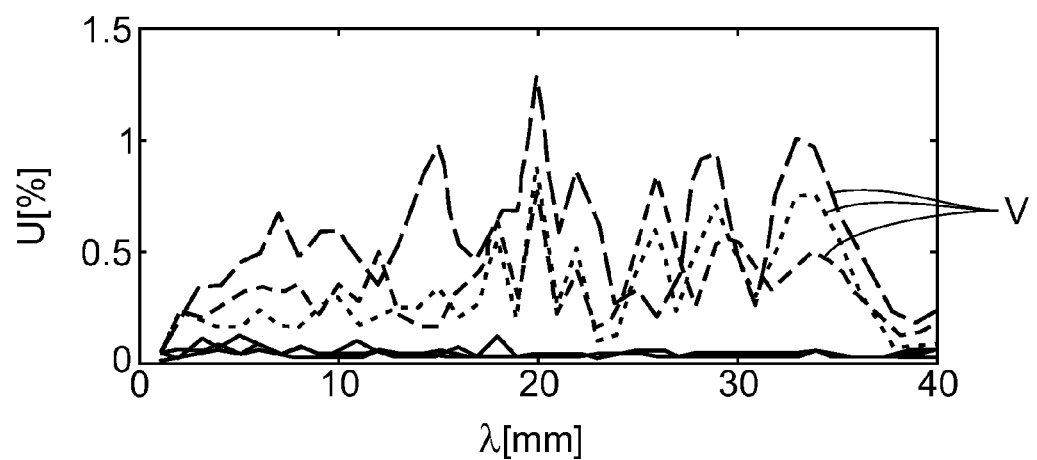
FIG. 11 shows an exemplary view of the effects of the collector according to the disclosure on a uniformity of an illumination intensity distribution on the reticle as a function of a local wavelength.

The uniformity U is one of the characteristics to quantify the quality of the illumination of the object field 5. The uniformity U is determined in accordance with the following formula:

$$U = \frac{SE_{max} - SE_{min}}{SE_{max} + SE_{min}} \times 100[\%],$$

wherein $SE_{max}$ and $SE_{min}$ designate the maximum or minimum scan-integrated energy over the field height of the object field 5. The smaller the value for the uniformity U, the more homogeneous and therefore better is the illumination of the object field 5. The influence of the course of the cooling elements 27 of the cooling device 26 of the collector 15, 33, 37 on the uniformity U of the illumination of the object field 5 is shown by way of example in FIG. 11. The dashed curves show the uniformity U of the intensity distribution in the object plane 6 here as a function of a local wavelength λ, of a radial distant field disturbance for the case of a cooling device, the cooling elements of which are rotationally symmetric with respect to the central axis 24. The continuous lines correspondingly show the influence of the cooling device 26 according to the disclosure. As can clearly be seen, the arrangement according to the disclosure of the cooling elements 27 leads to a considerable improvement in the uniformity U of the intensity distribution in the object plane 6.

When using the projection exposure system 1 with one of the above-described collector variants, the reticle 7 and the wafer 12, which carries a light-sensitive coating for the illumination light 14, are provided. At least one portion of the reticle 7 is then projected onto the wafer 12 with the aid of the projection exposure system 1. During the projection of the reticle 7 onto the wafer 12, the reticle holder 8 and/or the wafer holder 13 may be displaced in the direction parallel to the object plane 6 or parallel to the image plane 11. The displacement of the reticle 7 and the wafer 12 may preferably take place synchronously with respect to one another. Finally, the light-sensitive layer on the wafer 12 exposed by the illumination light 14 is developed. A microstructured or nanostructured component, in particular a semiconductor chip is thus produced.

What is claimed is:

1. An illumination system, comprising:
   an EUV collector configured to collect and transmit EUV radiation, the EUV collector comprising:
      a collector mirror configured to reflect the EUV radiation;
      a cooling device configured to cool the collector mirror; and
   an illumination optical system configured to illuminate an object field with the radiation collected by the collector, wherein:
      the collector mirror is rotationally symmetric with respect to a central axis;
      the illumination optical system further comprises a facet mirror comprising a plurality of facets configured to produce a defined illumination setting to illuminate the object field;
      the individual facets are arcuate-shaped with an arc of a circle segment; and
      the cooling device comprises a cooling element having a course with respect to the collector mirror such that a projection of the course into a plane perpendicular to the central axis has a main direction enclosing an angle of at most 20° with respect to a direction parallel to a chord of the arc of a circle segment of a facet.

2. The illumination system of claim 1, wherein the angle is at most 7° with respect to the direction.

3. The illumination system of claim 1, wherein the cooling element is a cooling channel that is loadable with a cooling medium.

4. The illumination system of claim 1, further comprising an EUV radiation source.

5. The illumination system of claim 1, wherein the illumination system is a microlithography illumination system.

6. A projection exposure system, comprising:
   an illumination system according to claim 1; and
   an imaging optical system configured to image the object field into an image field.

7. The projection exposure system of claim 6, wherein the projection exposure system is a microlithography projection exposure system.

8. The projection exposure system of claim 6, further comprising an EUV radiation source.

9. A method, comprising:
   providing a projection exposure system, comprising:
      an illumination system according to claim 1; and
      an imaging optical system configured to image the object field into an image field;
   using the projection exposure system to project a portion of a reticle onto a wafer having a light-sensitive coating; and
   developing the exposed light-sensitive coating.

10. An illumination system, comprising:
   an EUV collector configured to collect and transmit EUV radiation, the EUV collector comprising:
      a collector mirror configured to reflect the EUV radiation, the collector mirror being rotationally symmetric with respect to a central axis; and
      a cooling device configured to cool the collector mirror, the cooling device comprising a cooling element; and
   an illumination optical system configured to illuminate an object field with the radiation collected by the collector, the illumination optical system comprising a facet mirror comprising a plurality of facets configured to produce a defined illumination setting to illuminate the object field,
   wherein the cooling element has a course with respect to the collector mirror such that a projection of the course into a plane perpendicular to the central axis has a main direction enclosing an angle of at most 20° with respect to a longitudinal orientation of at least one of the plurality of facets.

11. A projection exposure system, comprising:
   an illumination system according to claim 10; and
   an imaging optical system configured to image the object field into an image field.

12. An illumination system, comprising:
   an EUV collector configured to collect and transmit EUV radiation, the EUV collector comprising:
      a collector mirror configured to reflect the EUV radiation, the collector mirror being rotationally symmetric with respect to a central axis; and
      a cooling device configured to cool the collector mirror, the cooling device comprising a cooling element; and
   an illumination optical system configured to illuminate an object field with the radiation collected by the collector, the illumination optical system comprising a facet mirror comprising a plurality of facets configured to produce a defined illumination setting to illuminate the object field,
   wherein the individual facets are arcuate-shaped with an arc of a circle segment, and the cooling element has a course with respect to the collector mirror such that a projection of the course into a plane perpendicular to the central axis has a main direction enclosing an angle of at most 20° with respect to a chord of the arc of a circle segment of a facet.

13. A projection exposure system, comprising:
   an illumination system according to claim 12; and
   an imaging optical system configured to image the object field into an image field.

* * * * *

UNITED STATES PATENT AND TRADEMARK OFFICE
CERTIFICATE OF CORRECTION

PATENT NO. : 9,007,559 B2  Page 1 of 1
APPLICATION NO. : 13/214470
DATED : April 14, 2015
INVENTOR(S) : Michael Layh and Udo Dinger It is certified that error appears in the above-identified patent and that said Letters Patent is hereby corrected as shown below:

Title page, after "Assistant Examiner", delete "Michell Iacoletti" and insert -- Michelle Iacoletti --.

In the Specification

Col. 8, line 56, delete "$\lambda$," and insert -- $\lambda$ --.

Signed and Sealed this
Eighth Day of September, 2015

Michelle K. Lee
*Director of the United States Patent and Trademark Office*